United States Patent
Japp et al.

(10) Patent No.: US 7,259,333 B2
(45) Date of Patent: *Aug. 21, 2007

(54) COMPOSITE LAMINATE CIRCUIT STRUCTURE

(75) Inventors: Robert Japp, Vestal, NY (US); Gregory Kevern, Endwell, NY (US); William Rudik, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/904,126

(22) Filed: Oct. 25, 2004

(65) Prior Publication Data

US 2005/0048408 A1    Mar. 3, 2005

Related U.S. Application Data

(62) Division of application No. 09/625,135, filed on Jul. 25, 2000, now Pat. No. 6,834,426.

(51) Int. Cl.
*H05K 1/03* (2006.01)

(52) U.S. Cl. ...................... 174/255; 174/262

(58) Field of Classification Search ............... 174/255, 174/262, 261, 264, 266, 263, 258, 259; 361/792, 361/793, 794, 795; 428/209
See application file for complete search history.

(56) References Cited

U.S. PATENT DOCUMENTS

| | | | |
|---|---|---|---|
| 4,030,190 A * | 6/1977 | Varker | 29/852 |
| 4,675,789 A * | 6/1987 | Kuwabara et al. | 361/794 |
| 4,755,911 A | 7/1988 | Suzuki | |
| 4,788,766 A | 12/1988 | Burger | |
| 4,864,722 A | 9/1989 | Lazzarini | |
| 4,868,350 A | 9/1989 | Hoffarth | |
| 5,220,723 A * | 6/1993 | Okada | 29/830 |
| 5,224,265 A | 7/1993 | Dux | |
| 5,558,928 A | 9/1996 | DiStefano | |
| 5,719,354 A | 2/1998 | Jester | |
| 5,736,679 A * | 4/1998 | Kresge et al. | 174/250 |
| 6,026,564 A | 2/2000 | Wang | |
| 6,171,946 B1 | 1/2001 | Tsukamoto | |
| 6,175,087 B1 | 1/2001 | Keesler | |
| 6,201,194 B1 | 3/2001 | Lauffer | |
| 6,323,439 B1 * | 11/2001 | Kambe et al. | 174/262 |

FOREIGN PATENT DOCUMENTS

JP    6-302964    10/1994

* cited by examiner

*Primary Examiner*—Ishwar (I. B.) Patel
(74) *Attorney, Agent, or Firm*—Connolly Bove Lodge & Hutz, LLP

(57) ABSTRACT

A laminate circuit structure assembly is provided that comprises at least two modularized circuitized voltage plane subassemblies; optionally an interposer located between each of the subassemblies, and wherein the subassemblies and interposer, if present, are bonded together with a cured dielectric coating. The interposer comprises dielectric layers disposed about an internal electrically conductive layer.

20 Claims, 4 Drawing Sheets

2S1P with Drilled Powers and Vias

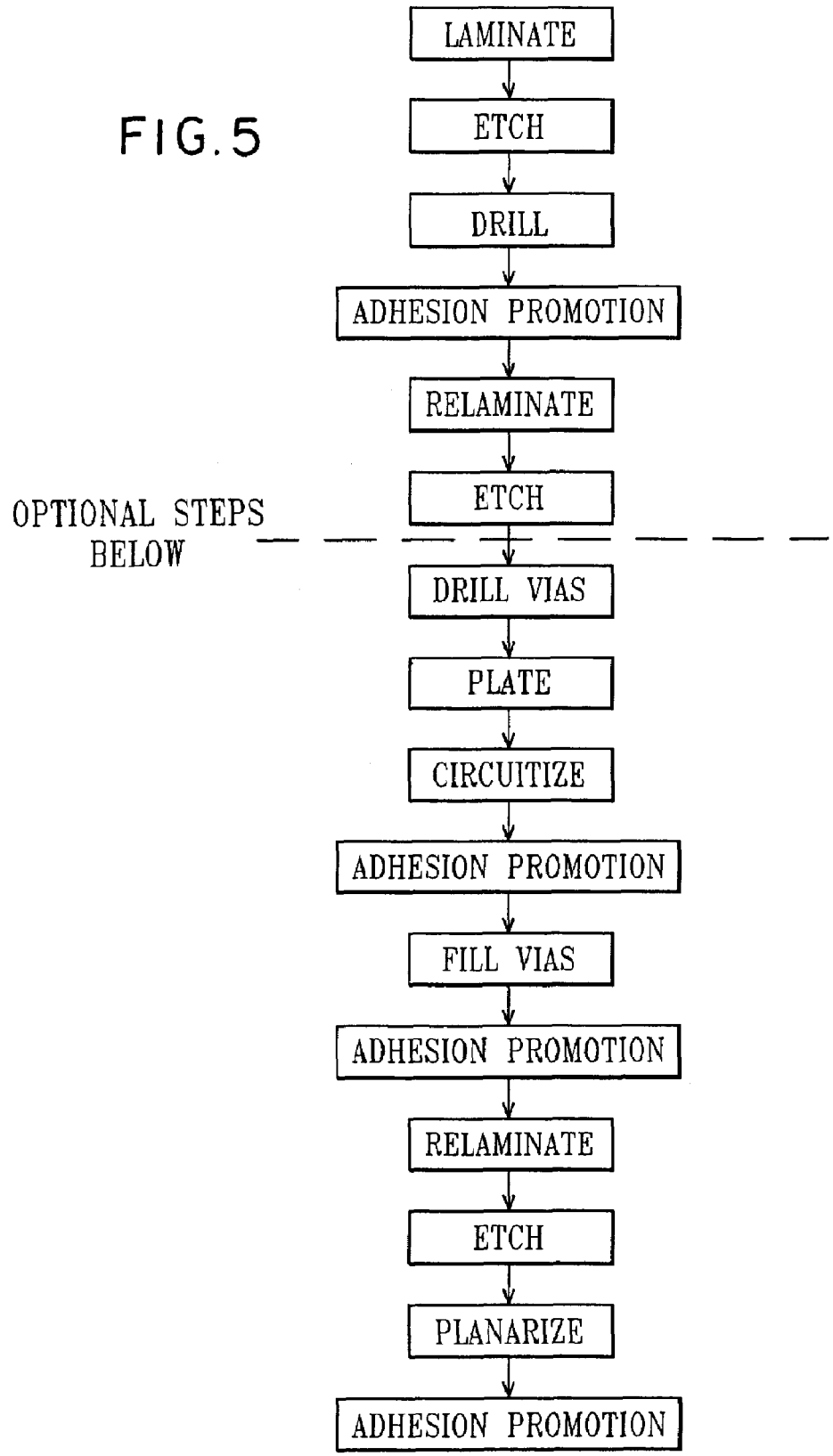

COMPOSITE LAMINATE CIRCUIT STRUCTURE

CROSS REFERENCE TO RELATED APPLICATIONS

This Application is a Division of application Ser. No. 09/625,135 filed on Jul. 25, 2000, now U.S. Pat. No. 6,834,426 the entire contents of which are incorporated herein by reference.

TECHNICAL FIELD

The present invention relates to laminate circuit structures, and more particularly to composite laminate circuit structures constructed from a plurality of modularized circuitized voltage plane subassemblies bonded together. The present invention also relates to a method for fabricating the laminate circuit structures. The present invention provides for planar, fine line external circuit flat lines and does not require an additional adhesive sheet nor glass cloth reinforcement.

BACKGROUND OF INVENTION

A conventional technique of forming a laminate circuit board structures includes forming layers of dielectric material and electrically conducting material to provide multiple layers of circuits and voltage planes. Voltage planes can be either ground plane or power planes, and are sometimes collectively referred to as power planes.

Conventional printed circuit boards are typically constructed from glass cloth prepreg and copper. Normally copper clad laminates (CCL's) are circuitized and then "laid up" with other circuitized cores and additional sticker prepreg to form composites. Once laminated, conventional composite boards are drilled and then plated. While conventional boards can be either tri-plate or strip line constructions, both use conventional prepreg as sticker sheets. Both designs, especially stripline/buried via designs, also usually utilize signal to power plane referencing through the sticker sheet layer, on at least one side of the signal line.

Composites constructed using 2S1P building blocks offer a number of advantages over conventional construction techniques. One of these advantages is testable impedance prior to composite lamination. The impedance is also predominately controlled by the core dielectric. This is a major advantage as core layer dielectrics are not effected by the complex geometries and fill requirements that occur at composite lamination. 2S1P's built with glass cloth free materials facilitate very high circuit density by allowing very small, laser drilled holes to be made. One very important aspect of using 2S1P's to build high density composite printed circuit boards (PCBs) is the method used to adhere the 2S1P's into a composite board.

Prior methods of making 2S1P cores involve drilling or etching clearance holes in bare sheets, e.g., 2 oz., 1 oz. and/or 0.5 oz., copper and then laminating and fully curing these with conventional prepregs or coated foils to produce a core that could be circuitized forming the signal planes. Likewise, prior 0S1P's have been fabricated in similar manners. These methods are difficult to practice due to the problems associated with handling bare copper. 2S1P's can also be made by circuitizing one side of a core with the power pattern then relaminating additional prepreg or coated copper over the circuitized power pattern.

Regardless of the method used to make the 2S1P cores, they must now be stuck together using additional "sticker" materials placed between the 2S1P's and the 0S1P's. These additional sticker sheets contribute additional thickness and exacerbate all the problems associated with additional thickness.

More recently, techniques have been provided that provide a relatively inexpensive photolithographic technique of forming a composite laminate structure from individual discrete laminate structures into a composite laminate structure. Along these lines see U.S. application Ser. No. 09/203,945 entitled "Two Signal One Power Plane Circuit Board," Ser. No. 09/203,978 entitled "Multi-Layer Organic Chip Carrier Package" and Ser. No. 09/204,458 entitled "Composite Laminate Circuit and Method of Forming the Same," entire disclosures of which are incorporated herein by reference.

Although the structures and methods of these inventions provide significant advances and advantages over current printed wire board (PWB) fabrication methods, there still exists a need for further refinement. Therefore continuing efforts are underway in attempting to provide for even greater advantages.

SUMMARY OF INVENTION

The present invention makes possible thinner laminate circuit structures, and therefore making possible higher density PCBs with fewer processing steps. The subject invention teaches new ways to form 2S1P and 0S1P components using novel methods, some of which also simplify or solve problems of how to adhere these components together into a composite, in some cases without the corresponding increase in composite thickness necessitated by the prior art.

In addition, the structures of the present invention do not require glass cloth reinforcement.

The present invention improves and simplifies the process for customizing the power planes as well as opening up numerous new possibilities in methods to construct the component cores.

The present invention comprises novel ways for adhering together the subassemblies.

The 2S1P and 0S1P structures taught by the present invention each comprise two basic variations. Methods 1, 3, and 5 disclosed below describe how to build 2S1P structures without via holes. 0S1P methods 1 through 4 disclosed below each describe methods of building 0S1P structures each with an option to form conductive holes through the structure. 2S1P methods 1, 3, and 5 and all of the 0S1P methods disclosed below without the conductive hole option exercised are intended for use in composites in which the electrical interconnection scheme will be by conventional composite through hole drilling and plating, thus the conductive pathways will be formed at the composite level. Therefore no need exists for drilling and plating or drilling and filling vias or through holes at the sub component level. 2S1P options 2, 4, and 6 and all of the 0S1P options disclosed below in which the optional through holes have been formed are intended for use in composites in which advanced non-conventional interconnect methods will be employed. Some of these methods include, stacked holes filled with conductive adhesive, stacked dendrite contact, or metal to metal joining.

More particularly, the laminate circuit structure assembly of the present invention comprises at least two modularized circuitized voltage plane subassemblies wherein each of the subassemblies comprise at least two signal planes disposed about an internal voltage plane. Dielectric material is located between the signal and voltage planes. Dielectric is also present on each external surface of each signal plane.

The subassemblies are bonded together into composites with the same dielectric compositions which are used to construct the subassemblies. This is a strategically important part of the invention. For the purposes of physically bonding the 2S1P and 0S1P assemblies no unique adhesives need be used. Additional process steps, (not shown), will be needed to effect electrical interconnection between the vias. For instance, if stacked vias filled with conductive adhesive is the chosen method of interconnection, then each time a 2S1P via is filled or a 0S1P through hole is filled, they will need to be filled with a conductive adhesive instead of the standard dielectrics as described herein. If stacked dendrites, stacked solder connections or stacked liquid phase metal joining are to be used then filling with the dielectric materials as described is acceptable. These aspects are not discussed at length or detail in this application since alterations necessary to the adopt the described electrical interconnection methods will be apparent to those skilled in the art.

Optionally, an interposer can be located between each of the subassemblies and the cured dielectric wherein the interposer comprises dielectric layers disposed about an internal electrically conductive layer.

The present invention also relates to a method for fabricating a laminate circuit structure assembly. The method comprises providing at least two modularized circuitized voltage plane subassemblies wherein each of the subassemblies comprise at least two signal planes disposed about an internal voltage plane. The signal planes each have an external surface and an internal surface. Dielectric material is located between the signal and voltage planes. At least one via is disposed within each subassembly for providing electrical communication between the signal planes and electrical connection to another of the subassemblies. Dielectric is also provided on each external surface of each signal plane.

An uncured or partially cured curable dielectric composition is located between the subassemblies. The dielectric composition may comprise, various thermosetting resins such as BT epoxy, (bismaleimide-triazine/epoxy blends), difunctional or multifunctional epoxies, cyanate ester resins, polyimide resins, allyated PPO, (polyphenylene ether oxide resins), or cross linked butadiene rubber, or, optionally, various thermoplastic resins such as thermoplastic polyimides, various fluoroploymers, or PPO.

Optionally, an interposer can be located between the subassemblies wherein the interposer comprises dielectric layers are disposed about an internal electrically conductive layer.

The structure is then laminated to cause bonding of the interposer to the subassemblies.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

FIG. 5 is a flow chart illustrating various alternative sequences that can be followed pursuant to the present invention.

BEST AND VARIOUS MODES FOR CARRYING OUT INVENTION

Figure 1:
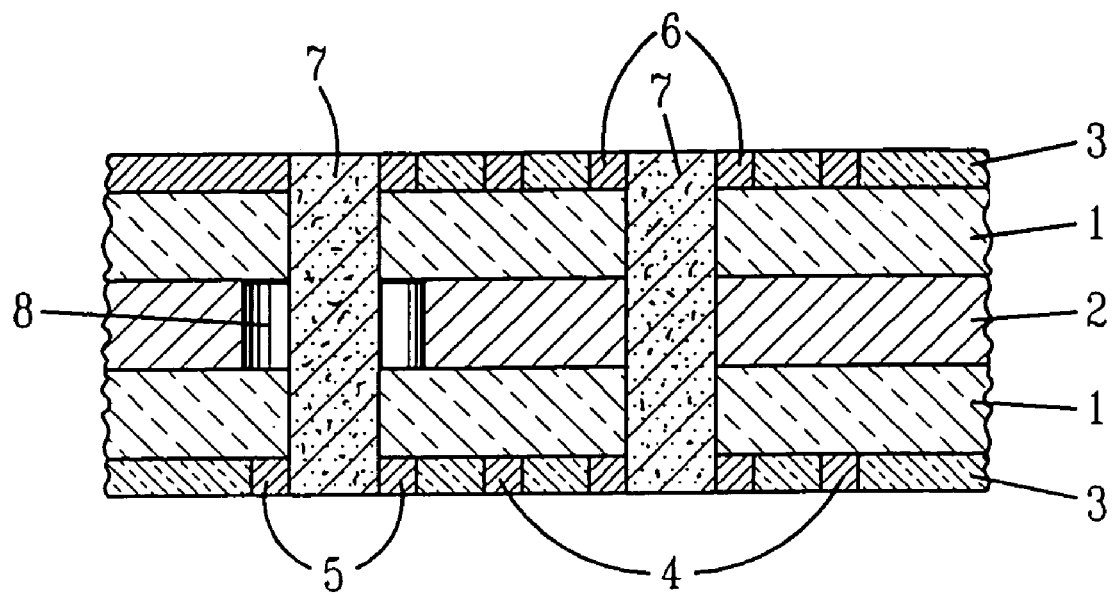
FIG. 1 illustrates a 2S1P structure with vias according to the present invention.

In order to facilitate an understanding of the present invention, reference will be made to the figures wherein the same numerals in different figures refer to the same or corresponding structures. Also in order to facilitate an understanding of the present invention, reference will be made to structures from 2S1P (2 signal plane-1 power plane) and 0S1P (0 signal plane-1 power plane) components.

Typically, the primary technique for fabricating the above subassembly components comprises applying a sheet of resin, (carried either on copper foil or, on an organic, peelable carrier film such as polyester), to either one or both sides of a 1 oz. or 0.5 oz. double treated copper sheet. During application the resin may or may not be fully cured.

Process flows to fabricate 2S1P and 0S1P subassemblies, covering a number of variations dependent on whether the power plane patterns are to be personalized by etching or drilling, and whether or not they will contain vias will be discussed herein.

It should be understood that, in many cases carrier foils made out of alternative metal can be substituted for copper.

Additionally while this specification will largely disclose structures built with resin coated metal foils and resin coated organic carrier foils, it will be apparent to those skilled in the art that the same structures can be formed with slight process alterations using conventional epoxy glass prepregs.

Method 1—2S1P Components with Etched Power Planes and No-Vias (Fully Cured Version):

The fully cured version 2S1P components having etched power planes and no vias can be fabricated by laminating two resin coated copper sheets or a coated copper sheet and a copper sheet and fully curing the resin. The resin can be an organic thermoplastic or thermosetting resin. A typical resin coated sheet is available under trade designation RCC from Allied Signal Laminate Systems. The foil layer which is subsequently to become the power plane is preferably double treated. Double treat is copper foil which has had a rough copper oxide/brass adhesion promotion layer applied to both sides.

The copper layer which is to become the power plane is patterned using conventional photolithographic techniques, while the copper layer on the other side, which is to become one of the signal layers is protected with a blanket exposed layer of photoresist. The copper used to form the power plane is, most preferably a double treat copper. Single treated copper can be used for the power plane layer but will also require the additional adhesion promotion treatment application described below.

The structure is relaminated with another resin coated copper sheet and the resin is fully cured. The two outside signal patterns are then photo patterned and etched.

Additional optional planarization and/or adhesion steps can be carried out. For example, an adhesion promotion step can be employed such as applying an oxide treatment or alternative adhesion promotion treatment, especially if single sided treatment copper were used in forming any of the above power or signal layers. Suitable adhesion promotion treatments include, but are not limited to, copper oxide formation treatments, reduced copper oxide treatment, various silane treatments, tin oxide/silane treatments, and micro etch treatments with Entek or BTA passivation, or the like. One specific example of an acceptable adhesion promotion treatment is Attotech corporation's BONDFILM treatment. The thicknesses of these treatments as recommended by the suppliers of these treatment chemistries are generally acceptable for the purposes of the present invention.

The structure can then be relaminated with another resin coated copper sheet. This layer of dielectric is applied primarily to act as the adhesive at the composite level. This outer layer of dielectric will be partially cured. The surface can be planarized by well known techniques. If desired this resin can be cured, partially cured or remain uncured. If the cure is advanced to only the B-stage, this dielectric can be used later as an adhesive during composite lamination.

The copper carrier is etched or the film carrier, if present, is peeled away.

Method 2—2S1P Components with Etched Power Planes and Vias (Fully Cured Version):

The fully cured version 2S1P components having etched power planes and vias can be fabricated by laminating two resin coated copper coated sheets or a resin coated copper sheet and a copper sheet and fully curing the resin. The foil layer which is subsequently to become the power plane is preferably double treated.

A photoresist is applied using conventional techniques. The pattern on the power plane side is exposed and the signal core side, which is to be protected is blanket exposed. The photoresist on both sides is developed, etched, and stripped on both sides creating the power plane hole pattern using conventional techniques. Some adaptation such as etching frames to prevent curling may be desirable. An adhesion promotion step can be employed such as applying an oxide treatment or alternative adhesion promotion treatment, especially if single sided treatment copper were used in forming any of the above power or signal layers.

The structure is then relaminated with another resin coated copper sheet followed by fully curing the resin. If desired, the outside copper foils are etched down using fluid head etching. Fluid head etching is a technique which is capable of very uniformly etching down the thickness of a large copper surface. This is often done to thin the outside copper layer down so that additional copper can be deposited in the drilled holes, (and on the etched surface), without the differences in thickness between the two being too great.

The desired vias are then drilled and the holes and surfaces are then blanket plated with a conductive metal such as copper. The drilling can be carried out by mechanical or laser drilling. If desired, the holes can optionally be filled with a conductive adhesive, using a conventional hole fill process. The plated holes are then tented over by applying a photoresist using conventional techniques. Both sides are exposed to the signal patterns. The two outside signal planes are created by developing, etching, and stripping the photoresist using conventional techniques.

Additional optional planarization and/or adhesive application steps can be carried out. For instance, an adhesion promotion process can be employed such as applying an oxide to the copper signal plane features.

The structure is then relaminated with another resin coated copper sheet or a resin coated film is applied to fill the via holes. The surface is planarized by well know techniques. If desired, the resin can be cured, partially cured or left uncured.

The copper is then etched or the film carrier, if present, is peeled away.

Method 3—2S1P Components with Drilled Power Planes and No Vias (Fully Cured and Relaminated Version):

The fully cured and relaminated version of 2S1P components having drilled power planes and no vias can be fabricated by laminating two resin coated copper sheets onto a sheet of double treated copper. The copper foils are then etched on both sides of the structure. The power clearance hole pattern is created by drilling through the entire structure. An adhesion promotion step can be employed such as applying an oxide treatment or alternative adhesion promotion treatment. The structure is then relaminated with another pair of resin coated copper sheets thereby filling the holes followed by fully curing the resin. The resin from the second pair of resin coated copper sheets fills the holes.

A photoresist is applied using conventional techniques. Both sides are exposed to the signal patterns. The two outside signal planes are created by developing, etching, and stripping the photoresist by using conventional techniques.

Additional optional planarization and/or adhesive application steps can be carried out. For example, an adhesion promotion step can be employed such as applying an oxide. The structure can then be relaminated with another resin coated copper sheet or a resin coated film can be applied. If desired, the resin can be cured, partially cured or left uncured. If the cure is advanced to only the B-stage, this dielectric can be used later as an adhesive during composite lamination. The copper is etched or the film carrier, if present is peeled away.

Method 4—2S1P with Drilled Power Planes and Vias (Fully Cured and Relaminated Version):

The fully cured and relaminated version of 2S1P components having drilled power planes and vias can be fabricated by laminating two resin coated copper sheets onto a sheet of double treated copper. The copper foils are then etched off both sides of the structure. The power clearance hole pattern is created by drilling through the entire structure. An adhesion promotion step can be employed such as applying an oxide treatment or alternative adhesion promotion treatment. The structure is then relaminated with another resin coated copper sheet thereby filling the clearance holes. The resin is then fully cured.

If needed, the outside foils can be etched down such as by fluid head etching.

Vias are then drilled in the structure followed by blanket plating a conductive metal in the holes and over the surface. A photoresist is applied using conventional techniques. Both sides are exposed to the signal patterns. The two outside signal planes are created by developing, etching, and stripping the photoresist by using conventional techniques.

Additional optional planarization and/or adhesive application steps can be carried out. For example, an adhesion promotion step can be employed such as applying an oxide. The structure can then be relaminated with another resin coated copper sheet or a resin coated film can be applied to fill the via holes. If desired, the resin can be cured, partially cured or remain uncured. If the cure is advanced to only the B-stage, this dielectric can be used later as an adhesive during composite lamination. The copper is then etched or the film carrier, if present, is peeled away. The surface is planarized by well known techniques to remove excess resin.

In addition, an adhesion promotion step can be employed at this stage such as applying an oxide treatment or alternative adhesion promotion treatment.

Method 5—2S1P with Drilled Power Planes and No Vias (Non-Fully Cured and Relaminated Version):

The non-fully cured and relaminated version of 2S1P components having drilled power planes and no vias can be fabricated by applying two resin coated films to both sides of a sheet of double treated copper. The cure is not advanced at this stage. The copper foils are etched off both sides of the structure or the carrier film is peeled away. The power clearance hole pattern is created by drilling through the entire structure. An adhesion promotion step can be employed such as applying an oxide treatment or alternative adhesion promotion treatment. The structure is then relaminated with copper foil on both sides and the uncured resin is reflowed thereby filling the holes. Optionally, instead of copper an additional resin coated copper sheet can be used to assist in hole fill. If desired, the outside copper foils are etched down using fluid head etching. Fluid head etching is a technique which is capable of very uniformly etching down the thickness of a large copper surface. This is often done to thin the outside copper layer down so that additional copper can be deposited in the drilled holes, (and on the etched surface), without the differences in thickness between the two being too great. The resin is then fully cured. A photoresist is applied using conventional techniques. Both sides are exposed to the signal patterns. The two outside signal planes are created by developing, etching, and stripping the photoresist by using conventional techniques.

Additional optional adhesive application steps can be carried out. For example, the structure can be relaminated with a resin coated copper sheet or a resin coated film can be applied. The cure is not advanced. If the cure is advanced to only the B-stage, this dielectric can be used later as an adhesive during composite lamination. The copper is then etched or the film carrier, if present, is peeled away.

Method 6—2S1P with Drilled Power Planes and Vias (Not Fully Cured after Relamination Version):

The non-fully cured after relamination version of 2S1P components having drilled power and vias can be fabricated by applying two resin coated films to both sides of a sheet of double treated copper. The cure is not advanced at this stage. The copper foil is etched off both sides or the carrier film (typically Mylar) is peeled off both sides. The power clearance hole pattern is created by drilling through the entire structure. An adhesion promotion step can be employed such as applying an oxide treatment or alternative adhesion promotion treatment. The structure is then relaminated with another copper foil on both sides and the uncured resin is caused to reflow filling the holes. Optionally, resin coated copper sheets can be applied instead of plain treated copper to assist in the hole fill. The resin is then fully cured in this lamination step. The outside foils are etched down, typically using a fluid head etch.

The vias are then drilled followed by blanket plating the holes and surfaces with a conductive metal such as copper. Optionally, the vias can be filled with a conductive adhesive. A photoresist is applied using conventional techniques. Both sides are exposed to the signal patterns. The two outside signal planes are created by developing, etching, and stripping the photoresist by using conventional techniques.

Additional optional planarization and/or adhesive application steps can be carried out. For example, an adhesion promotion step can be employed such as applying an oxide. The structure can then be relaminated with another resin coated copper sheet or a resin coated film can be applied to fill the via holes. The planarization can be carried out by well known techniques. If desired, the resin can be cured, partially cured or remain uncured. If the cure is advanced to only the B-stage, this dielectric can be used later as an adhesive during composite lamination. The copper is etched or the film carrier, if present, is peeled away.

In addition, an adhesion promotion step can be employed at this stage such as applying an oxide treatment or alternative adhesion promotion treatment.

Alternatively, any of the above processes can be modified such as by performing the signal and/or power plane circuitization steps using additive circuitization as is well known in the art.

Method 7—0S1P with Etched Power Planes (Fully Cured Version):

0S1P components having etched power planes can be fabricated by laminating two resin coated copper sheets or an resin coated copper sheet and a copper sheet and fully curing the resin. The foil layer which is subsequently to become the power plane is preferably double treated. The power pattern is then etched on one side while protecting the foil on the other side. An adaptation such as etching frames to prevent curling may be desirable. The structure is relaminated with another resin coated copper sheet on one side only and the resin is fully cured.

The outside copper layers are etched or the film carrier is peeled away by conventional techniques. Optionally, holes can be drilled by mechanical or laser drilling. Also the surface and holes, if present, can be blanket seeded and plated with a conductive metal using conventional techniques. The plated holes, if present, can optionally be tented over by applying a photoresist using conventional techniques. Both sides are exposed to the signal patterns. The two outside signal planes are created by developing, etching, and stripping the photoresist using conventional techniques.

Additional optional adhesion promotion steps can be carried out. For instance, an adhesion promotion process can be employed such as applying an oxide to the copper signal plane features. If desired, the holes can optionally be filled with a conductive adhesive, using a conventional hole fill process and excess adhesive removed.

Additional optional adhesive application steps can be carried out. For example, the structure can be relaminated with another resin coated copper sheet or a resin coated film can be applied. The cure is not advanced. The copper is etched or the film carrier, if present, is peeled away.

The copper is then etched or the film carrier, if present, is peeled away. The surface is planarized by well known techniques to remove excess resin.

In addition, an adhesion promotion step can be employed at this stage such as applying an oxide treatment or alternative adhesion promotion treatment.

Method 8—0S1P with Drilled Power Planes (Fully Cured Version):

The fully cured version of 0S1P components having drilled power planes can be fabricated by applying two resin coated copper sheets to both sides of a sheet of double treated copper. The cure of the resin is not advanced at this stage. The copper foils are etched or the carrier film (e.g., Mylar) is peeled off both sides of the structure. The power clearance hole pattern is created by drilling through the entire structure. Additional optional adhesive promotion steps can be carried out. For instance, an adhesion promotion process can be employed such as applying an oxide.

The structure is relaminated with additional resin coated copper sheets or resin coated films whereby the resin fills the holes. The resin is then fully cured.

The two outside copper foils are etched or the two carrier films are peeled off.

Optionally, holes can be drilled by mechanical or laser drilling. Also the surface and holes, if present, can be blanket seeded and plated with a conductive metal using conventional techniques. The plated holes, if present, can optionally be tented over by applying a photoresist using conventional techniques. Both sides are exposed to the signal patterns. The two outside signal planes are created by developing, etching, and stripping the photoresist using conventional techniques.

Additional optional adhesive promotion steps can be carried out. For instance, an adhesion promotion process can be employed such as applying an oxide to the copper signal plane features. If desired, the holes can optionally be filled with a conductive adhesive, using a conventional hole fill process and excess adhesive removed.

Additional optional adhesive application steps can be carried out. For example, the structure can be relaminated with another resin coated copper sheet or a resin coated copper film can be applied. The cure of the resin is not advanced. The copper is etched or the film carrier, if present, is peeled away. The copper is then etched or the film carrier, if present, is peeled away. The surface is planarized by well known techniques to remove excess resin.

In addition, an adhesion promotion step can be employed at this stage such as applying an oxide treatment or alternative adhesion promotion treatment.

Method 9—0S1P with Drilled Power Planes (Non-Fully Cured after First Lamination and Then Fully Cured after Second Lamination Version):

The version of 0S1P having drilled power planes and being non-fully cured after the first lamination but fully cured after the second lamination can be fabricated by laminating two resin coated copper coated sheets or applying two resin coated copper films to both sides of a sheet of double treated copper. The cure of the resin is not advanced at this stage. The copper foils are etched off both sides, or the carrier film is peeled off. The power clearance hole pattern is created by drilling through the entire structure. In addition, an adhesion promotion step can be employed at this stage such as applying an oxide treatment or alternative adhesion promotion treatment.

The structure is relaminated with copper, shiny copper foil or a release sheet on both sides of the copper foil. Optionally, resin coated copper sheets can be applied instead of plain treated copper to assist in the hole fill. The uncured resin is reflowed filling the holes followed by curing the resin. The copper is etched or the shiny copper is peeled off or the release film is peeled off.

Optionally, holes can be drilled by mechanical or laser drilling. Also the surface and holes, if present, can be blanket seeded and plated with a conductive metal using conventional techniques. The plated holes, if present, can optionally be tented over by applying a photoresist using conventional techniques. Both sides are exposed to the signal patterns. The two outside signal planes are created by developing, etching, and stripping the photoresist using conventional techniques.

Additional optional adhesive promotion steps can be carried out. For instance, an adhesion promotion process can be employed such as applying an oxide to the copper signal plane features. If desired, the holes can optionally be filled with a conductive adhesive, using a conventional hole fill process and excess adhesive removed.

Additional optional adhesive application steps can be carried out. For example, the structure can be relaminated with another resin coated copper sheet or a resin coated copper film can be applied. The cure of the resin is not advanced. The copper is etched or the film carrier, if present, is peeled away. The surface is planarized by well known techniques to remove excess resin.

In addition, an adhesion promotion step can be employed at this stage such as applying an oxide treatment or alternative adhesion promotion treatment.

Method 10—0S1P with Drilled Power Planes (Non-Fully Cured version):

The non-fully cured version of 0S1P components drilled power planes can be fabricated by laminating two resin coated copper sheets or by applying two resin coated copper films to both sides of a sheet of double treated copper. The cure of the resin is not advanced.

The copper foils are etched off both sides or the carrier film is peeled off. The power clearance hole pattern is created by drilling through the entire structure. In addition, an adhesion promotion step can be employed at this stage such as applying an oxide treatment or alternative adhesion promotion treatment.

The structure is relaminated with copper, shiny copper foil or a release film, such as Teflon. The uncured resin is reflowed filling the holes. Optionally, resin coated copper sheets can be applied instead of plain treated copper to assist in the hole fill. The resin cure is not advanced. The copper foil is etched or the shiny copper or release film is peeled off.

Optionally, holes can be drilled by mechanical or laser drilling. Also the surface and holes, if present, can be blanket seeded and plated with a conductive metal using conventional techniques. The plated holes, if present, can optionally be tented over by applying a photoresist using conventional techniques. Both sides are exposed to the signal patterns. The two outside signal planes are created by developing, etching, and stripping the photoresist using conventional techniques.

Additional optional adhesive promotion steps can be carried out. For instance, an adhesion promotion process can be employed such as applying an oxide to the copper signal plane features. If desired, the holes can optionally be filled with a conductive adhesive, using a conventional hole fill process and excess adhesive removed.

Additional optional adhesive application steps can be carried out. For example, the structure can be relaminated with another resin coated copper coated sheet or a resin coated copper film can be applied. The cure of the resin is not advanced. The copper is etched or the film carrier, if present, is peeled away. The surface is planarized by well known techniques to remove excess resin.

In addition, an adhesion promotion step can be employed at this stage such as applying an oxide treatment or alternative adhesion promotion treatment.

It is understood that various modifications of any of the above methods can be employed if and when desired. For instance, instead of using a double treated double sheets for fabricating power planes, a single treated foil can be used. However, such would require an additional adhesion promotion step at an appropriate stage. Likewise, it may be desirable especially from a cost effectiveness standpoint to employ conventional hole fill techniques for the through vias instead of the relamination with a resin coated copper sheet. Also, etch power plane techniques can be used in producing 2S2P and 0S2P cross sections. These core structures offer certain advantages in constructing stripline cross sections, including improved capacitance, power distribution and thickness reduction.

Furthermore, if desired hybrid structures such as performing the above resin coated copper sheet or film carried resin processing can be formed on conventional glass containing prepreg cores, thereby potentially reducing cost by both material and processing savings. This would apply particularly to conventional double sided etched cores used as the starting point for 2S2P and 0S2P structures.

In any event, the above described 2S1Ps and if desired 0S1Ps can be laid up next to each other in various combinations to form for example tri-plate or stripline structure provided that at least one of adjoining subassemblies contains uncured resin on its outside surface to act as an adhesive bonding layer. If desired, all of the cores can have the uncured or B-staged sticker coating or only every other core needs to have an adhesive layer thereon.

According to the present invention, the dielectric compositions employed as the adhesive comprise the following ingredients and in the following relative amounts:

One important consideration in dielectric or adhesive selection is whether or not material will be expected to withstand exposure to water, (during photolithographic processing and etching), while in the B-staged or uncured state. Some materials are capable of this while such exposure causes irreversible detrimental changes in others, such as inability to be fully cured at a later time. Thus selection of an appropriate dielectric for the intended build methodology is important. The BT/epoxy blends, various epoxies and cyanate esters, are examples of materials which can tolerate moisture exposure while B-staged and still be successfully fully cured later. The APPE and most polyimides are examples of materials that are not water tolerant in the B-stage. Thermoplastic materials in general are water tolerant. Materials that are not water tolerant can be used in many of the build methodologies described earlier, but not the methodologies which require relamination after exposure to water.

Typical acceptable BT formulations include, but are not limited to, BT/epoxies comprising about 4% bismaleimide polyimide, about 20% brominated difunctional epoxy, about 5% tetrafunctional epoxy, about 20% highly brominated epoxy, and about 30% cyanate ester resin with about 0.03% zinc octuate added as catalyst. Other acceptable commercially available BT/epoxies include the Mitsubishi 830 and 832 BT/epoxy formulations. These materials are water tolerant in the B-stage.

Acceptable epoxies include most of those that do not contain DICY, (dicyandiamide), and include, but are not limited to, Ciba 8123, and Shell 2414 both of which use approximately 0.15% 2-methylimiazole as the catalyst. These materials are water tolerant in the B-stage.

Acceptable cyanate esters include N-7000 sold by Nelco. This material is water tolerant in the B-stage.

Acceptable APPE materials include S-2100, S-2122, S-3100 and S3122 and the coated copper version of these PC-5100, made by Asahi Chemical and equivalent products. Also acceptable is the polymer coated film APPE material made by Asahi. These materials are not water tolerant in the B-stage.

The thickness of the coated material used depends on many factors including the weight of the power plane, whether the holes are etched or drilled, what the desired finished board electrical impedance is, and whether the subject dielectric layer is being used to fill power plane holes, signal planes vias, or simply as the adhesive layer. In general thickness of about 1.5 to about 2.0 mils applied to either side of the etched power plane copper are sufficient to fill the holes. The thickness required to fill holes drilled in power planes and the adjacent dielectric depends on whether the adjacent dielectric was B-staged or fully cured when it was applied, but generally about 2.0 to about 2.5 mils applied to both sides of the drilled power plane assembly will fill the drilled holes. Dielectric layers whose job is to act as the adhesive layer at composite lamination can be between about 0.25 and about 1.0 mils thick depending on whether the outside surfaces of every component are coated or if only every other component is coated.

The lamination of the structure is typically carried out at temperatures of about 100° to about 200° C. for about 15 minutes to about 90 minutes and at a pressure of about 100 psi to about 500 psi.

It has been determined according to the present invention that the uncured or partially cured compositions employed can be exposed to the liquid processing chemicals, dried, subsequently reflowed or reflowed and then cured thereby enabling one coating pass to perform multiple functions as contrasted to prior techniques which required several coating passes. These functions include, stiffening and improving the handling of thin copper sheets, flowing to fill holes and planarizing, and reflowing to adhere layers of a composite together. The compositions employed pursuant to the present invention exhibit a combination of having low moisture absorption, low chemical interaction with moisture, being slow curing over a wide temperature range between flow onset and cure, and has particular flow characteristics. This combination of characteristics makes it possible to achieve the various objectives according to the present invention.

FIG. 1 illustrates a 2S1P subassembly with vias after planarization wherein, numeral 1 represents first dielectric layers and numeral 2 represents a power plane. Numeral 3 represents second dielectric layers. Numeral 4 represents signal lines and 5 represents signal via. Numeral 6 represents power connected via and 7 represents a conductive adhesive filled via. Numeral 8 represents drilled or etched clearance hole. The subassembly of FIG. 1 can be fabricated by Methods 2, 4 and 6.

Figure 2:
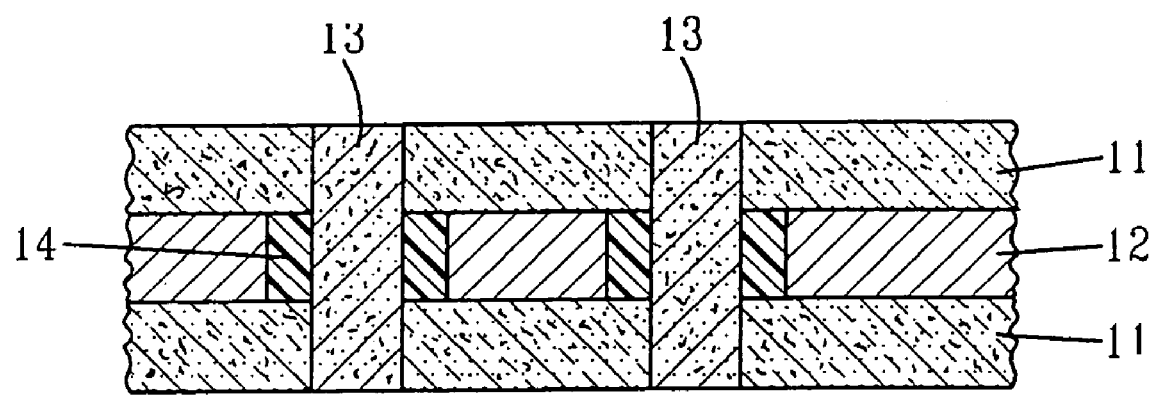
FIG. 2 illustrates a 0S1P structure with vias according to the present invention.

FIG. 2 illustrates a 0S1P subassembly with vias wherein numeral 11 represents a B-staged dielectric adhesive and 12 a power or ground plane. Numeral 13 represents conductive adhesive filled via and 14, a resin filled clearance hole.

Figure 3:
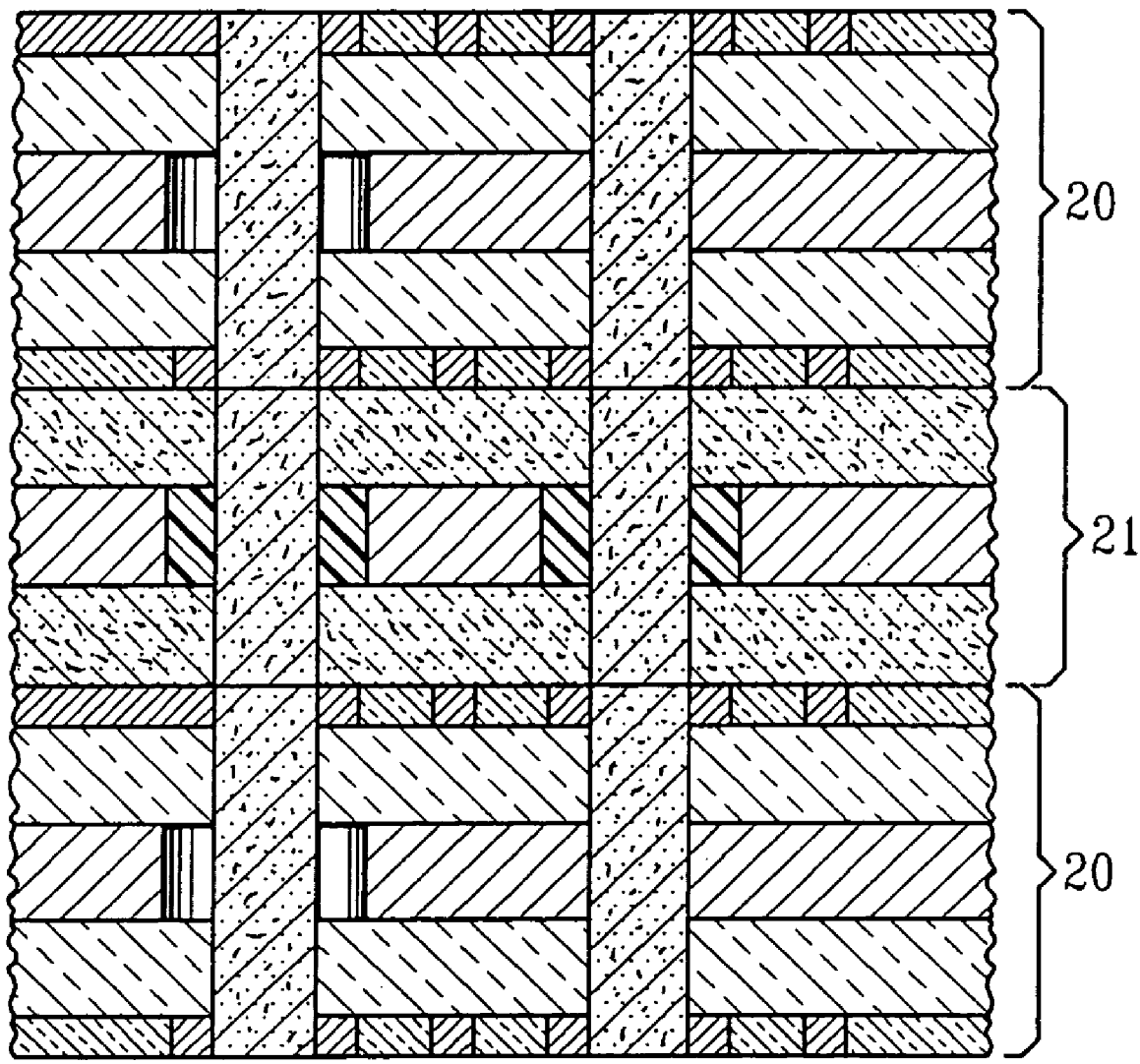
FIG. 3 illustrates a structure of the present invention after laminating.
Figure 4:
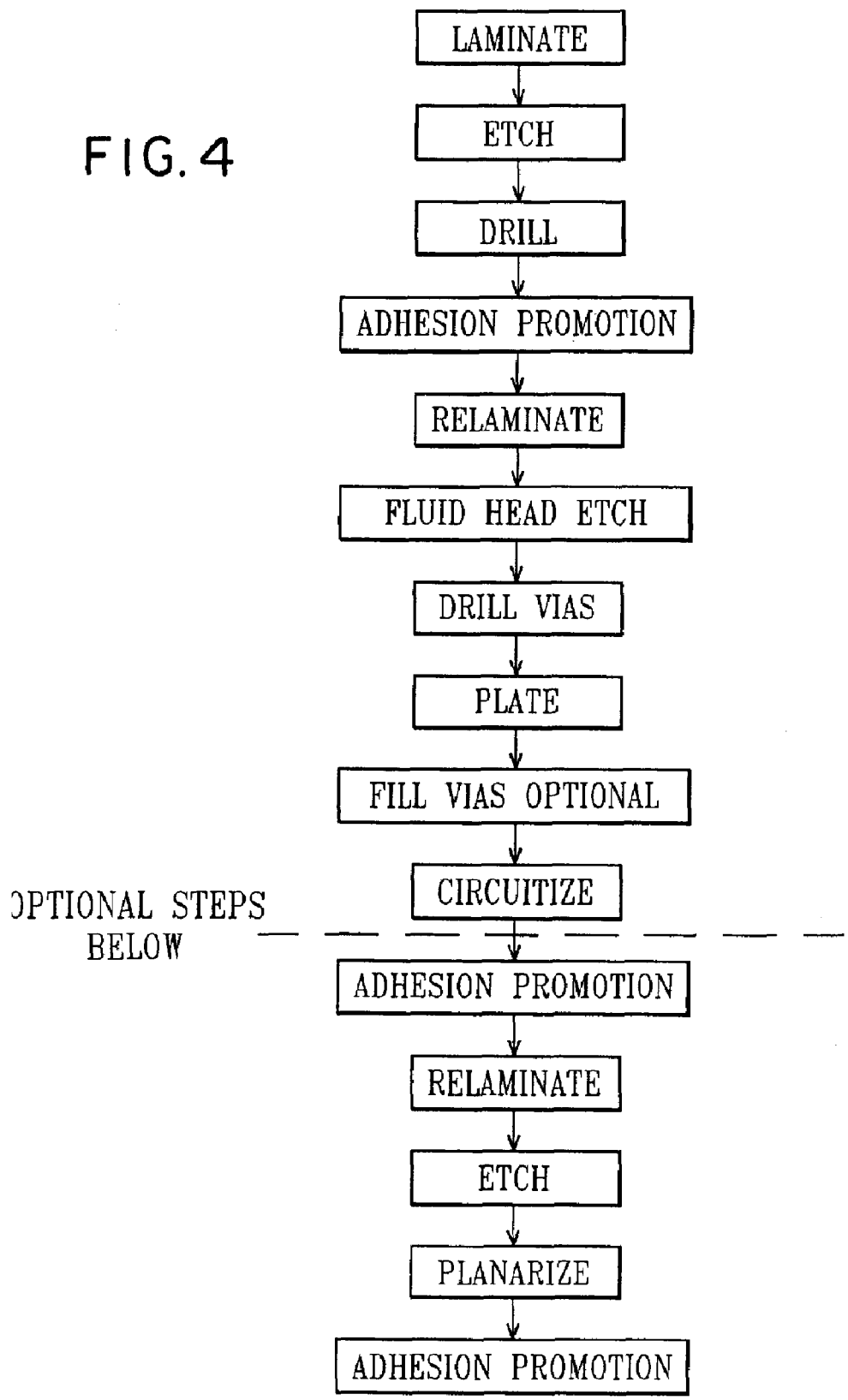
FIG. 4 is a flow chart illustrating various alternative sequences that can be followed pursuant to the present invention.

FIG. 3 illustrates, a structure of the present invention after laminating wherein numeral 20 represents 2SIP subassemblies according to FIG. 1 and 21 represents 0S1P subassembly according to FIG. 2.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

Also, it is intended that the appended claims be construed to include alternative embodiments.

What is claimed as new and desired to be protected by Letters Patent of the United States is:

1. A laminate circuit structure assembly comprising at least two modularized circuitized voltage plane subassemblies wherein each of the subassemblies comprise at least two signal planes having an external and internal surface disposed about an internal voltage plane; dielectric between the signal and voltage planes; and dielectric on each external surface of each signal plane and coplanar with each signal plane; and wherein the subassemblies are bonded together with a cured dielectric from a composition comprising the same dielectric used in said subassemblies, and further comprising an interposer about 3 mils to about 10 mils thick located between the subassemblies wherein the interposer located between the subassemblies comprises dielectric layers disposed about an internal electrically conductive layer.

2. The laminate circuit structure of claim 1 wherein the dielectric of at least one of the surfaces that is bonded is from said composition.

3. The laminate circuit structure assembly of claim 2 being free from glass cloth reinforcement.

4. The laminate circuit structure assembly of claim 3 having planar, fine line external circuit flat lines.

5. The laminate circuit structure assembly of claim 2 having planar, fine line external circuit flat lines.

6. The laminated circuit structure of claim 1 wherein vias are disposed within each subassembly for providing electrical communication between signal planes and electrical connection to another subassembly.

7. The laminate circuit structure assembly of claim 6 wherein the vias through the signal planes are plated with a conductive metal.

8. The laminate circuit structure assembly of claim 7 being free from glass cloth reinforcement.

9. The laminate circuit structure assembly of claim 8 having planar, fine line external circuit flat lines.

10. The laminate circuit structure assembly of claim 7 having planar, fine line external circuit flat lines.

11. The laminate circuit structure assembly of claim 6 being free from glass cloth reinforcement.

12. The laminate circuit structure assembly of claim 11 having planar, fine line external circuit flat lines.

13. The laminate circuit structure assembly of claim 6 having planar, fine line external circuit flat lines.

14. The laminate circuit structure assembly of claim 1 wherein the internal electrically conductive layer of the interposer is copper.

15. The laminate circuit structure assembly of claim 14 being free from glass cloth reinforcement.

16. The laminate circuit structure assembly of claim 15 having planar, fine line external circuit flat lines.

17. The laminate circuit structure assembly of claim 14 having planar, fine line external circuit flat lines.

18. The laminate circuit structure assembly of claim 1 being free from glass cloth reinforcement.

19. The laminate circuit structure assembly of claim 18 having planar, fine line external circuit flat lines.

20. The laminate circuit structure assembly of claim 1 having planar, tine line external circuit flat lines.

* * * * *